United States Patent [19]

Peyre Lavigne et al.

[11] Patent Number: 5,038,054
[45] Date of Patent: Aug. 6, 1991

[54] PROTECTED DARLINGTON TRANSISTOR ARRANGEMENT

[75] Inventors: Andre Peyre Lavigne; Philippe Lance; Michael Bairanzade, all of Toulouse, France

[73] Assignee: Motorola, Inc., Schaumburg, Ill.

[21] Appl. No.: 380,064

[22] Filed: Jul. 14, 1989

[30] Foreign Application Priority Data

Feb. 17, 1989 [GB] United Kingdom ............ 8903697.4

[51] Int. Cl.$^5$ .......................... H03K 3/26; H02H 7/20
[52] U.S. Cl. .................................. 307/315; 307/318; 307/296.4; 361/91
[58] Field of Search ............ 307/315, 318, 254, 296.4; 361/91

[56] References Cited

U.S. PATENT DOCUMENTS

| | | | |
|---|---|---|---|
| 3,435,295 | 3/1969 | Ladd, Jr. et al. | 307/315 |
| 4,461,979 | 7/1984 | Jeenick et al. | 307/315 |
| 4,539,492 | 9/1985 | Michel et al. | 307/315 |
| 4,633,283 | 12/1986 | Avery | 361/91 |
| 4,754,158 | 6/1988 | Halberstein | 307/315 |
| 4,755,694 | 7/1988 | Bodig et al. | 307/315 |
| 4,902,921 | 2/1990 | Hiramoto et al. | 307/315 |
| 4,924,341 | 5/1990 | Culp et al. | 361/91 |

FOREIGN PATENT DOCUMENTS

| | | | |
|---|---|---|---|
| 7412430 | 11/1975 | France | 361/91 |
| 0008444 | 1/1979 | Japan | 307/315 |

Primary Examiner—Stanley D. Miller
Assistant Examiner—Terry D. Cunningham
Attorney, Agent, or Firm—Robert M. Handy; Eugene A. Parsons

[57] ABSTRACT

A protected Darlington transistor arrangement comprising: first (2) and second (4) bipolar transistors each having a base, a collector and an emitter, the base of the first transistor being coupled to the base (B) of the Darlington transistor, the collectors of the first and second transistors being coupled to the collector (C) of the Darlington transistor, the emitter of the first transistor being coupled to the base of the second transistor, and the emitter of the second transistor being coupled to the emitter (E) of the Darlington transistor; and a third bipolar transistor (6) having a base, a collector coupled to the collector of the Darlington transistor, and an emitter, wherein the Darlington transistor arrangement further comprises: a Zener diode (8) coupled between the collector of the Darlington transistor and the base of the third transistor, the base of the third transistor being coupled to the emitter of the second transistor, and the emitter of the third transistor being coupled to the base of the second transistor.

17 Claims, 2 Drawing Sheets

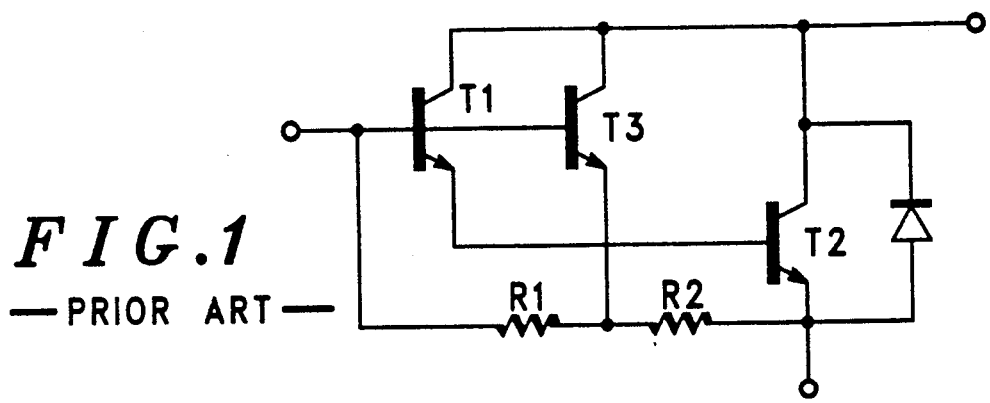
FIG. 1 —PRIOR ART—
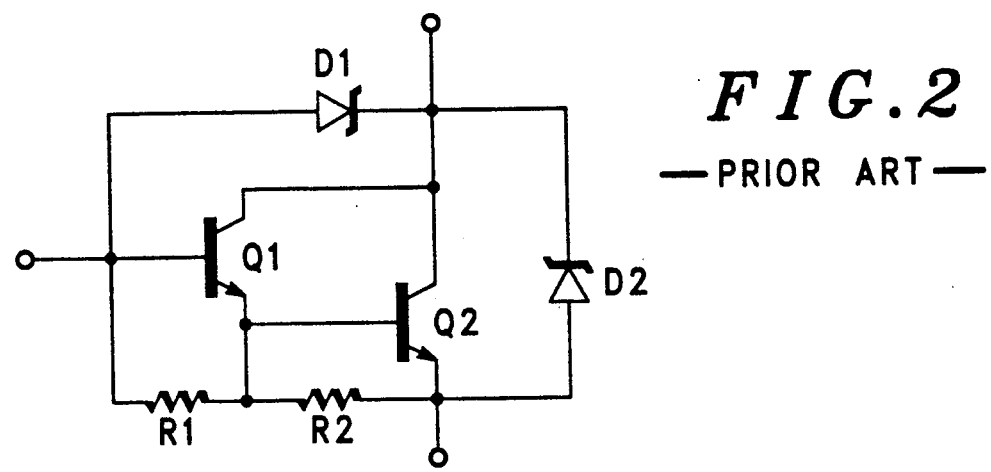
FIG. 2 —PRIOR ART—
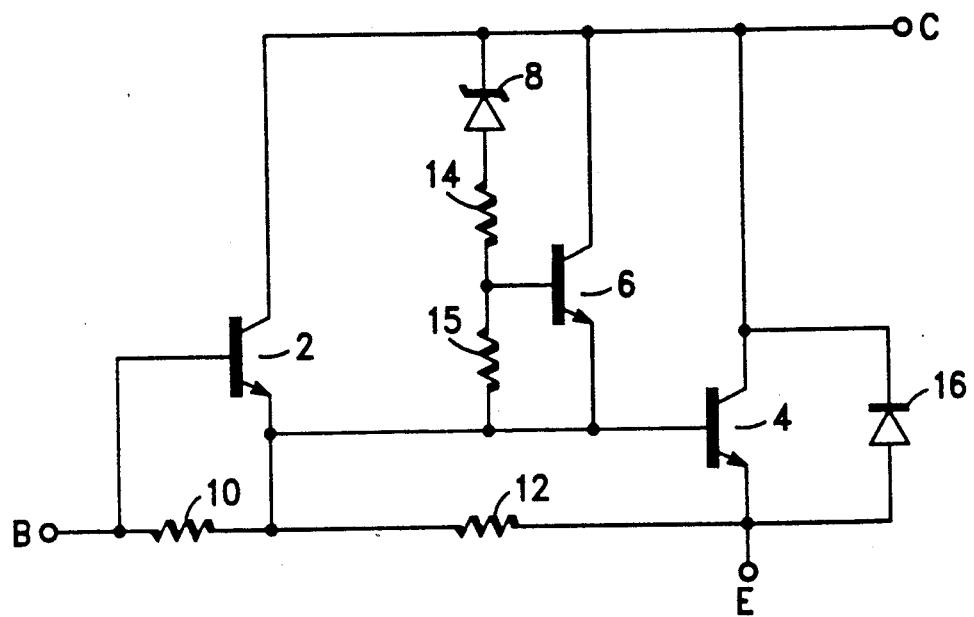
FIG. 3

PROTECTED DARLINGTON TRANSISTOR ARRANGEMENT

INTRODUCTION

This invention relates to Darlington transistor arrangements and particularly to such arrangements having over-voltage protection. Such protected Darlington transistor arrangements find application in, for example, automotive applications which are subject to ignition, or solenoid drive, induced voltage spikes.

It is known to provide a protected Darlington transistor arrangement comprising:

first and second bipolar transistors each having a base, a collector and an emitter, the base of the first transistor being coupled to the base of the Darlington transistor, the collectors of the first and second transistors being coupled to the collector of the Darlington transistor, the emitter of the first transistor being coupled to the base of the second transistor, and the emitter of the second transistor being coupled to the emitter of the Darlington transistor; and a third bipolar transistor having a base, a collector coupled to the collector of the Darlington transistor, and an emitter.

Such an arrangement is shown in FIG. 1 of the accompanying drawings in which the base of the third transistor is connected to the base of the Darlington transistor and the emitter of the third transistor is connected to a point between two resistors connected in series between the base of the first transistor and the emitter of the second transistor.

The protected Darlington transistor arrangement of FIG. 1 has a number of disadvantages: it is subject to unwanted oscillation which can cause reliability problems in the field; there is typically a delay of 500 ns or more before the protection provided by the third transistor comes into effect; and the protection provided varies widely over a working temperature range of −40° C. to +125° C.

It is also known, for example from Japanese patent no. 4293368, to protect a Darlington transistor by using an arrangement which is shown in FIG. 2 of the accompanying drawings and which is similar to that of FIG. 1 except that the third transistor is replaced by a Zener diode connected between the base and collector of the first transistor. Such a protected Darlington transistor arrangement suffers from the following disadvantages: there will typically be a delay of 2 μs before the protection provided by the Zener diode comes into effect; the breakdown voltage of the Zener diode will typically vary by more than 60 V over a working temperature range of −40° C. to +125° C. the protection is highly dependent on the impedance connected between the base and emitter of the Darlington transistor.

It is an object of the present invention to provide a protected Darlington transistor arrangement wherein one or more of the above mentioned disadvantages may be overcome or at least alleviated.

SUMMARY OF THE INVENTION

In accordance with the present invention there is provided a protected Darlington transistor arrangement comprising:

first and second bipolar transistors each having a base, a collector and an emitter, the base of the first transistor being coupled to the base of the Darlington transistor, the collectors of the first and second transistors being coupled to the collector of the Darlington transistor, the emitter of the first transistor being coupled to the base of the second transistor, and the emitter of the second transistor being coupled to the emitter of the Darlington transistor; and a third bipolar transistor having a base, a collector coupled to the collector of the Darlington transistor, and an emitter, wherein the Darlington transistor arrangement further comprises:

a Zener diode coupled between the collector of the Darlington transistor and the base of the third transistor, the base of the third transistor being coupled to the emitter of the second transistor, and the emitter of the third transistor being coupled to the base of the second transistor.

BRIEF DESCRIPTION OF DRAWINGS

One protected Darlington transistor arrangement in accordance with the present invention will now be described, by way of example only, with reference to the accompanying drawings, in which:

FIG. 1 shows a circuit diagram of the already referred to first prior art protected Darlington transistor arrangement;

FIG. 2 shows a circuit diagram of the already referred to second prior art protected Darlington transistor arrangement;

FIG. 3 shows a circuit diagram of the protected Darlington transistor arrangement in accordance with the present invention.

DESCRIPTION OF PREFERRED EMBODIMENT

Figure 4:
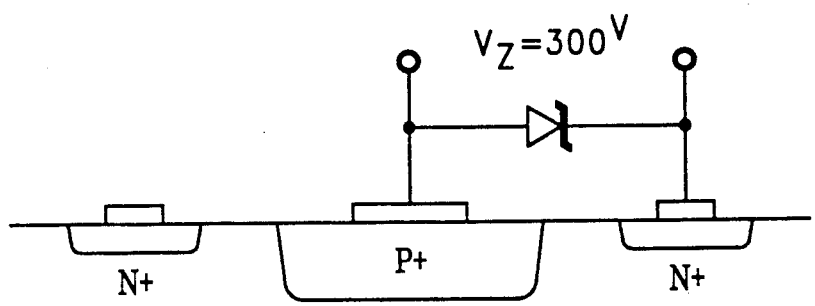
FIG. 4 shows a Zener diode formed as a pinch off device having lateral p+ and n+ layers.

Referring firstly to FIG. 1, a first known protected Darlington transistor arrangement comprises first and second bipolar transistors T1, T2 connected in conventional Darlington configuration. A third bipolar transistor T3 has its base and collector connected respectively to the base and collector of the transistor T1, and has its emitter connected to the common point of two resistors R1, R2 connected serially between the base of transistor T1 and the emitter of transistor T2. A protection diode D is provided across the collector and emitter of the transistor T2 to protect the transistor in the event of voltage of the wrong polarity being applied thereto. As discussed above, in such a known arrangement the connection of the emitter of the third transistor T3 to the common point of resistors R1, R2 gives rise to unwanted oscillation which can cause reliability problems in the field, there is typically a delay of 500 ns or more before the protection provided by the third transistor comes into effect, and the protection provided varies widely over a working temperature range of −40° C. to +125° C.

Referring now to FIG. 2, a second known protected Darlington transistor arrangement comprises first and second bipolar transistors Q1, Q2 connected in conventional Darlington configuration. A Zener diode D1 is connected across the base and collector of transistor Q1, and transistor Q1 has its emitter connected to the middle of a potential divider formed by resistors r1, r2 connected serially between the base of transistor Q1 and the emitter of transistor Q2. A protection Zener diode D2 is provided across the collector and emitter of the transistor Q2 to protect the transistor in the event of voltage of the wrong polarity being applied thereto. As discussed above, in such a known arrangement there will typically be a delay of 2µs before the protection provided by the Zener diode comes into effect, and the breakdown voltage of the Zener diode will typically vary by more than 60 V over a working temperature range of −40° C. to +125° C., the protection depending upon the base to emitter impedance of the Darlington transistor.

Referring now to FIG. 3, a protected Darlington transistor arrangement in accordance with a preferred embodiment of the invention includes a first bipolar npn transistor 2 and a second bipolar npn transistor 4 connected in conventional Darlington configuration, the base of the first transistor 2 being connected to the base B of the Darlington transistor, the collectors of the first and second transistors being connected to the collector C of the Darlington transistor, the emitter of the first transistor being connected to the base of the second transistor, and the emitter of the second transistor being connected to the emitter E of the Darlington transistor.

A third bipolar npn transistor 6 has its collector connected to the collector C of the Darlington transistor and has its emitter connected, with the emitter of the first transistor, to the base of the second transistor 4. Resistors 10, 12 are connected in series between the base of transistor 2 and the emitter of transistor 4. A Zener diode 8 has its cathode connected to the collector C of the Darlington transistor and has its anode connected to the base of the transistor 6 via a resistor 14. A further resistor 15 is connected between the base of transistor 6 and the common point of the resistors 10, 12. The common point of the resistors 10, 12 ia also connected to the emitter of transistor 2. A protection diode 16 is provided across the collector and emitter of the second transistor 4 to protect the transistor in the event of voltage of the wrong polarity being applied thereto. The values of the resistors 10 and 12 are typically approximately 500Ω and 30Ω respectively, the value of the resistor 14 is in the range approximately 2KΩ–6KΩ and the value of the resistor 15 is approximately 80Ω.

In use of the Darlington transistor arrangement of FIG. 3, the first transistor 2 acts as driver stage and the second transistor 4 acts as output stage in conventional Darlington manner. The third transistor 6, together with the Zener diode 8 and the resistors 14 and 15, perform a clamp function to protect the Darlington pair 2, 4 in the event of voltage spikes appearing at the collector C of the Darlington transistor. It will be understood that as well as serving to provide the clamp function to protect the Darlington pair 2, 4 as described above, the third transistor 6 also serves to provide temperature compensation to the clamp function since the values of the resistors 14, 15 will vary with temperature in proportion to the variations in the values of the resistors 10, 12.

It will be appreciated that since the emitter of the third transistor 6 is connected to the base of the second transistor 4, rather than simply to the common point of the resistors 10, 12 as in the known arrangement of FIG. 1, unwanted oscillation in the arrangement of FIG. 3 is avoided.

It will also be appreciated that when an over-voltage spike occurs at the collector C of the Darlington transistor of FIG. 3, the protection provided by the clamp function components 6, 8, 14 and 15 comes into operation with only a short delay. The delay time is formed by the cumulative delay times of the Zener diode 8 (typically in the region of 100 ns) and the third transistor 6 (typically in the region of 50 ns, since the third transistor 6 need only be switched on sufficiently to sink a collector current of approximately 10 mA, rather than approximately 6A necessary to provide protection in the arrangement of FIG. 1). Thus the total delay time for over-voltage protection to come into effect in the arrangement of FIG. 3 is typically in the region of 150 ns, compared with delay times in the region of 500 ns and 2µs for the known arrangements of FIGS. 1 and 2 resectively.

It will also be appreciated that in view of the temperature compensation provided by the resistors 14 and 15, the protection provided by the clamp arrangement 6, 8, 14 & 15 exhibits greater temperature stability than the known arrangements of FIGS. 1 and 2. It will be appreciated that, since the protection elements 6, 8, 14 & 15 are not connected to the base of the Darlington transistor but to the base of transistor 4, the protection provided is insensitive to the impedance connected between the base and emitter of the Darlington transistor, producing an effective collector voltage clamp action whatever circuit may be connected to the base of the Darlington transistor.

Normally, the circuit arrangement of FIG. 3 will be made in integrated circuit form, in which case the Zener diode 8 may be advantageously formed as a pinch off device having lateral p+ and n+ layers as illustrated in FIG. 4. When the integrated circuit is made in this way, the Zener diode possesses low variation of breakdown voltage with temperature. In a typical integrated circuit implementation of the arrangement of FIG. 3 with the Zener diode 8 formed by lateral pinch off as described, the breakdown voltage of the Zener diode varies by approximately 10 V over a working temperature range of −40° C. to +125° C.

It will be appreciated that for certain applications, for example in use with TTL circuitry, the value of the resistor 10 may be made infinite, i.e. the resistor may be removed, without affecting the proper functioning of the circuit.

It will also be understood that in a variation of the circuit of FIG. 3 the emitter of the first transistor 2 need not be connected to the resistor 15 and to the common point of resistors 10, 12; instead the emitter of the transistor 2 may be connected to the base of the transistor 4 and to the emitter of the transistor 6, and the resistor 15 may be connected directly to the common point of resistors 10, 12.

It will be appreciated that although the embodiment of the invention has been described above in relation to FIG. 3 as incorporating npn transistors, the arrangement could readily be built alternatively in equivalent form (not shown) incorporating pnp transistors, without departing from the inventive principle.

We claim:

1. A protected Darlington transistor circuit having a base, collector and an emitter comprising:
  a first bipolar transistor, forming a driver stage of the Darlington transistor circuit, having a base, a collector and an emitter, the base of the first transistor being coupled to the base of the Darlington transistor circuit, and the collector of the first transistor being coupled to the collector of the Darlington transistor circuit;
  a second bipolar transistor forming the output stage of the Darlington transistor circuit and having a base, collector and an emitter, the base of the second transistor being directly coupled to the emitter of the first transistor, the collector of the second transistor being coupled to the collector of the Darlington transistor circuit and the emitter of the second transistor being coupled to the emitter of the Darlington transistor circuit; and a third bipolar transistor having a base, a collector coupled to the collector of the Darlington transistor circuit, and an emitter, wherein the Darlington transistor circuit further comprises:

a Zener diode coupled between the collector of the Darlington transistor circuit and the base of the third transistor, the base of the third transistor coupled to the emitter of the second transistor, and the emitter of the third transistor coupled to the base of the second transistor, whereby the zener diode and third transistor, in combination, protect the first and second bipolar transistors against high voltage spikes at the collector of the Darlington transistor circuit.

2. A Darlington transistor circuit according to claim 1 wherein the base of the third transistor is coupled to the emitter of the second transistor via a first resistor.

3. A Darlington transistor circuit according to claim 1 wherein the emitter of the first transistor is coupled to the emitter of the second transistor via a first resistor.

4. A Darlington transistor circuit according to claim 3 wherein the emitter of the first transistor is coupled to the base of the first transistor via a second resistor.

5. A Darlington transistor circuit according to claim 2 wherein the base of the third transistor is coupled to the first resistor via a second resistor.

6. A Darlington transistor circuit according to claim 1 wherein the Zener diode is coupled to the base of the third transistor via a resistor.

7. A Darlington transistor circuit according to claim 1 further comprising a protection diode coupled between the collector and the emitter of the Darlington transistor circuit.

8. A Darlington transistor circuit according to claim 1 wherein the Zener diode is formed as a pinch off device having lateral layers of p+ and n+ conductivity.

9. A Darlington transistor circuit according to claim 1 wherein the first, second and third transistors are npn transistors.

10. A Darlington transistor circuit according to claim 1 fabricated in integrated circuit form.

11. A protected Darlington circuit having first, second and third terminals, comprising:

first, second and third transistors, each having base, collector and emitter nodes, a Zener diode and at least first and second resistors, and wherein;

the collector nodes of the first, second and third transistors are coupled to the second terminal of the Darlington circuit;

the emitter node of the second transistor is coupled to the third terminal of the Darlington circuit;

the base node of the first transistor is coupled to the first terminal of the Darlington circuit;

the base node of the second transistor is coupled directly to the emitter node of the first transistor;

the emitter node of the third transistor is coupled to the base node of the second transistor;

the at least first and second resistors and the Zener diode are series coupled between the emitter node of the first transistor and the second terminal of the Darlington circuit in the sequence emitter node—first resistor—second resistor—diode—second terminal; and the base node of the third transistor is coupled to a node between the first and second resistor.

12. A Darlington circuit according to claim 11 wherein the emitter node of the first transistor is coupled to the emitter node of the second transistor via a third resistor.

13. A Darlington circuit according to claim 12 wherein the emitter node of the first transistor is coupled to the base node of the first transistor via a fourth resistor.

14. A Darlington circuit according to claim 12 further comprising a protection diode coupled between the second and third terminals of the Darlington circuit.

15. A Darlington circuit according to claim 11 wherein the Zener diode includes a pair of laterally disposed regions.

16. A Darlington circuit according to claim 11 wherein the first, second and third transistors are npn transistors.

17. A Darlington circuit according to claim 11 fabricated in integrated circuit form.

* * * * *